United States Patent
Huang et al.

(10) Patent No.: US 11,354,833 B2
(45) Date of Patent: Jun. 7, 2022

(54) K-SPACE TRAJECTORY INFIDELITY CORRECTION IN MAGNETIC RESONANCE IMAGING

(71) Applicant: Siemens Healthcare GmbH, Erlangen (DE)

(72) Inventors: Qiaoying Huang, Edison, NJ (US); Xiao Chen, Princeton, NJ (US); Mariappan S. Nadar, Plainsboro, NJ (US); Boris Mailhe, Plainsboro, NJ (US); Simon Arberet, Princeton, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 163 days.

(21) Appl. No.: 16/805,903

(22) Filed: Mar. 2, 2020

(65) Prior Publication Data

US 2021/0272335 A1 Sep. 2, 2021

(51) Int. Cl.
*G06K 9/00* (2022.01)
*G06T 11/00* (2006.01)
*G06T 7/00* (2017.01)
*G06T 15/08* (2011.01)

(52) U.S. Cl.
CPC .......... *G06T 11/008* (2013.01); *G06T 7/0012* (2013.01); *G06T 15/08* (2013.01); *G06T 2207/10088* (2013.01); *G06T 2207/20081* (2013.01); *G06T 2207/20084* (2013.01); *G06T 2207/30004* (2013.01)

(58) Field of Classification Search
CPC ..... G06T 11/008; G06T 7/0012; G06T 15/08; G06T 2207/30004; G06T 2207/20084; G06T 2207/20081; G06T 2207/10088

USPC .......................................................... 382/131
See application file for complete search history.

(56) References Cited

U.S. PATENT DOCUMENTS

| | | | |
|---|---|---|---|
| 7,888,935 B1 * | 2/2011 | Tan ................. | G01R 33/56518 324/309 |
| 2017/0372193 A1 * | 12/2017 | Mailhe ................. | G06T 5/001 |
| 2019/0378311 A1 * | 12/2019 | Mailhe ................. | G06N 3/088 |
| 2020/0300947 A1 * | 9/2020 | Wang ................. | G01R 33/4818 |
| 2020/0333410 A1 * | 10/2020 | Ruyters ............ | G01R 33/56572 |
| 2021/0106251 A1 * | 4/2021 | Lips ................. | G01R 33/56518 |

(Continued)

FOREIGN PATENT DOCUMENTS

WO WO-2020009282 A1 * 1/2020 ............. A61B 5/055

OTHER PUBLICATIONS

Campbell-Washburn, Adrienne E., et al. "Real-time distortion correction of spiral and echo planar images using the gradient system impulse response function." Magnetic resonance in medicine 75.6 (2016): 2278-2285.

(Continued)

*Primary Examiner* — Van D Huynh (57) ABSTRACT

For k-space trajectory infidelity correction, a model is machine trained to correct k-space measurements in k-space. K-space trajectory infidelity correction uses deep learning. Trajectory infidelity is corrected from a k-space point of view. Since the image artifacts arise from k-space acquisition distortion, a machine learning model is trained to correct in k-space, either changing values of k-space measurements or estimating the trajectory shifts in k-space.

17 Claims, 4 Drawing Sheets

(56) References Cited

U.S. PATENT DOCUMENTS

2021/0201477 A1\* 7/2021 Hu .......................... G06T 7/12

OTHER PUBLICATIONS

Zeng, D.Y., et al. "Deep residual network for off-resonance artifact correction with application to pediatric body MRA with 3D cones." Magnetic resonance in medicine, 82(4), May 2019. pp. 1398-1411.

\* cited by examiner

K-SPACE TRAJECTORY INFIDELITY CORRECTION IN MAGNETIC RESONANCE IMAGING

FIELD

This disclosure relates to magnetic resonance (MR) imaging generally, and more specifically to k-space trajectory infidelity correction in MR imaging.

BACKGROUND

In MR imaging, measurements are made in the frequency domain as k-space measurements. These measurements correspond to trajectories in the frequency domain, such as Cartesian, radial, or spiral trajectories, etc. K-space trajectory infidelity, where the actual acquired k-space location does not match the designed k-space trajectory, is a common issue in MR imaging. This trajectory infidelity causes various types of artifacts in reconstructed images. The type of artifact may depend on the actual application and include, among others, Nyquist ghosting in echo planar imaging (EPI) and off-resonance in non-Cartesian trajectories.

The artifacts may be removed or reduced. Conventional model-based methods retrospectively correct the k-space trajectory by image processing. Trade-offs are usually made between model complexity and computation cost. Deep learning has been used to remove the artifacts caused by the trajectory infidelity in the image space, where artifact contaminated images are input, and the targets are the artifact-free images. Artifact removal may risk altering representation of actual structure of the patient.

SUMMARY

By way of introduction, the preferred embodiments described below include methods, systems, instructions, and computer readable media for k-space trajectory infidelity correction. Using machine training, a model is trained to correct k-space measurements in k-space for trajectory infidelity.

In a first aspect, a method is provided for k-space trajectory infidelity correction in a MR imaging system. The MR imaging system scans a patient with an MR sequence. The scanning results in k-space measurements corresponding to k-space trajectories. The k-space measurements are corrected for errors in the k-space trajectories by input of the k-space measurements to a machine-learned model, which outputs corrected k-space measurements in response to the input. An MR image is reconstructed from the corrected k-space measurements. The MR image is displayed.

Any of various types of scans may be used. For example, echo planar imaging is used. As another example, MR scans with non-Cartesian trajectories are used.

A two- or three-dimensional distribution of pixels or voxels, respectively, representing an area or volume, respectively, of the patient is reconstructed. The MR image is rendered from the voxels or pixels to a two-dimensional display.

In one embodiment, the correction is by a deep learned autoencoder network as the machine-learned model. In a further embodiment, the machine learned model performing the correction was trained using a loss for trajectory shift, a loss for k-space correction, and a loss for an estimate of corrupted data estimated from the trajectory shift and the k-space correction.

Any of various architectures may be used for the machine-learned model. For example, the machine-learned model was trained as a first neural network trained in conjunction with a second neural network trained to estimate trajectory shifts. In this case, the second neural network as trained by be used to estimate trajectory shifts in response to input of the k-space data from the scanning.

In a second aspect, a system is provided for trajectory correction in MR imaging. An MR scanner is configured to scan a patient. The scan provides first scan data in a scan domain. An image processor is configured to alter trajectories of the first scan data by application of a machine-learned model to the first scan data. The machine-learned model outputs second scan data in the scan domain where the second scan data has the altered trajectories. The image processor is configured to reconstruct a representation in an object domain from the second scan data in the scan domain. A display is configured to display an MR image from the reconstructed representation.

In one embodiment, the MR scanner is configured to scan the patient with echo planar imaging or non-Cartesian trajectories. Two or three-dimensional imaging may be used, such as reconstructing a three-dimensional distribution of voxels representing a volume of the patient where the MR image is a rendering of the voxels to the display comprising a two-dimensional display.

In another embodiment, the machine-learned model is a deep learned encoder-decoder network. In other embodiments, the machine-learned model was previously trained using a loss for trajectory shift, a loss for k-space correction, and a loss for an estimate of corrupted data estimated from the trajectory shift and the k-space correction. The machine-learned model may have been trained as a first neural network trained in conjunction with a second neural network trained to estimate trajectory shifts. The image processor may be configured to estimate trajectory shifts by application of another machine-learned model. The trajectory shifts are estimated in response to input of the first scan data in the scan domain to the other machine-learned model.

In a third aspect, a method is provided for training a network for reducing artifacts from trajectory infidelity in MR imaging. A first neural network is defined to receive input k-space data. The first neural network is machine trained for correction of trajectory infidelity in the input k-space data. A machine-learned network resulting from the machine training is stored.

In one embodiment, the first neural network is defined as an image-to-image network. In another embodiment, deep learning by the first neural network learns to output changes to trajectories of the input k-space data in response to input of the input k-space data. The trajectories of the input k-space data are altered according to the output changes. The machine training uses a loss based on a difference between the input k-space data with the altered trajectories and a ground truth.

In other embodiments, a second neural network is defined to receive the input k-space data. The second neural network is defined to output a trajectory shift. The machine training includes joint training of the first and second neural networks. For example, the joint training uses first, second and third losses: the first loss being for corrected k-space data, the second loss being for the trajectory shift, and the third loss being for corrupted k-space data formed from the corrected k-space data and the trajectory shift.

The present invention is defined by the following claims, and nothing in this section should be taken as a limitation on those claims. Aspects, embodiments, or features of one type of claims (e.g., method for application, method for learning, or system) may be used in other types. Further aspects and advantages of the invention are discussed below in conjunction with the preferred embodiments and may be later claimed independently or in combination.

DETAILED DESCRIPTION

K-space trajectory infidelity correction uses deep learning. Trajectory infidelity is corrected from a k-space point of view. Since the image artifacts arise from k-space acquisition distortion, a machine learning model is trained to correct in k-space, either changing values of k-space measurements or estimating the trajectory shifts in k-space.

Figure 1:
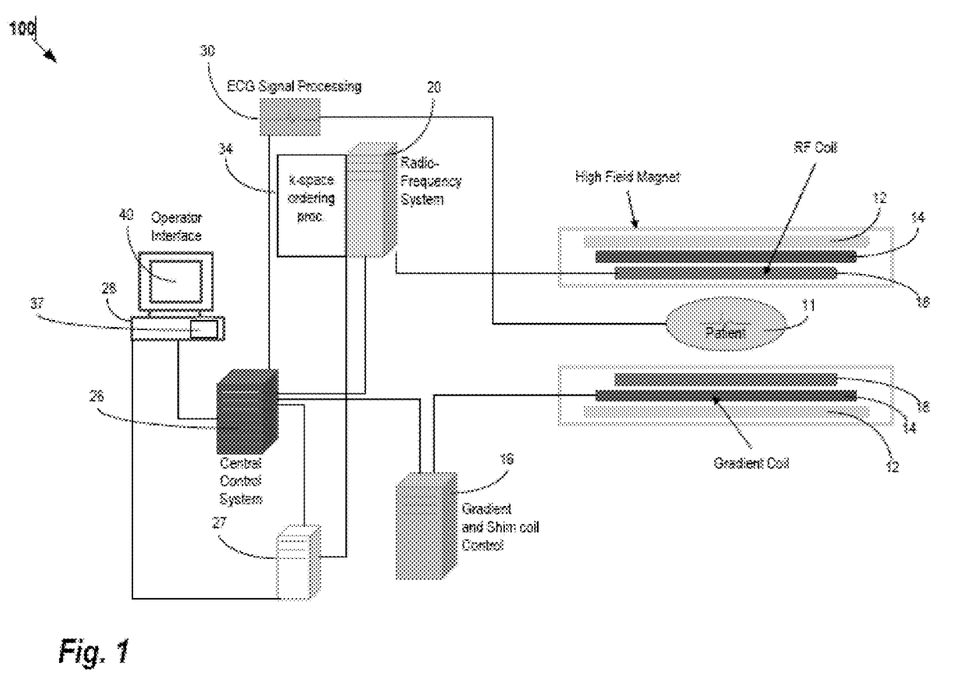
FIG. 1 is a block diagram of an embodiment of an MR system for medical imaging.

FIG. 1 shows one embodiment of an MR scanner system for acquiring k-space data. This acquired data may include trajectory infidelity. The locations of one or more trajectories in k-space or the frequency domain may be intended to be at a given location yet may be shifted. For example in a Cartesian trajectory scan, one or more trajectories along an axis may be shifted along an orthogonal axis. Different trajectories may be shifted by different amounts, such as even trajectories not shifted and odd trajectories shifted by 0.1-0.5 (e.g., change along x-axis by 0.1 normalized to trajectory spacing between grid points in the Cartesian grid of 1.0). As an example in a radial trajectory scan, one or more of the trajectories do not pass through a center or given location through which other trajectories pass.

Figure 4:
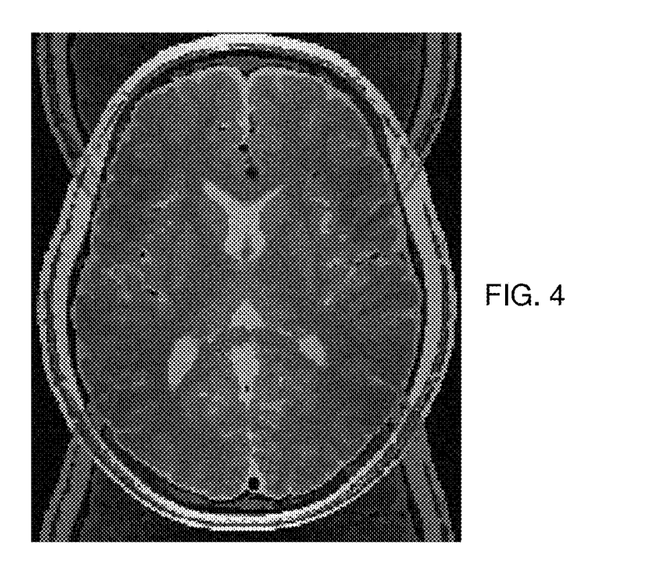
FIG. 4 is an example MR image with a Nyquist ghost artifact.

For reconstruction, the locations of the trajectories for Fourier transformation are assumed to be the locations established by the scan protocol. Where shifts due to infidelity occur, artifacts may be created in the reconstructed representation. For example, FIG. 4 shows a MR image after reconstruction from an echo planar image scan using Cartesian trajectories with every even numbered (i.e., every other) trajectory shifted by 0.4 along the axis for which the trajectory extends (i.e., trajectory extending along the x-axis where the trajectory is shifted along the x-axis by 0.4 of one grid point such as the origin of the trajectory being 0.4, 6.0 for the sixth trajectory across y instead of 0.0, 6.0).

Figure 2:
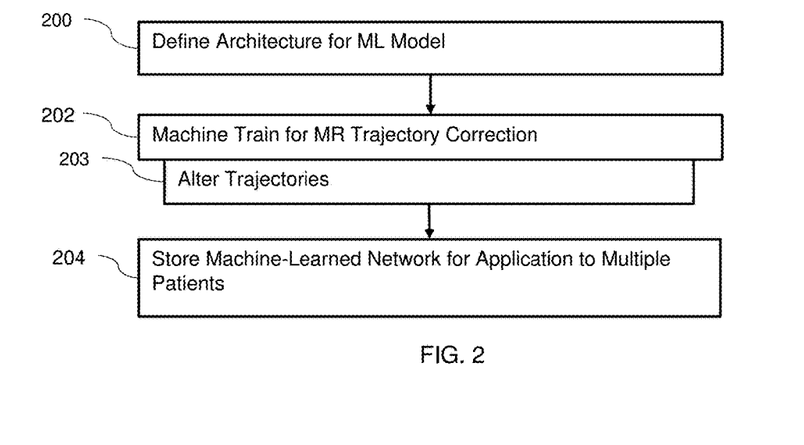
FIG. 2 is a flow chart diagram of one embodiment of a method for machine training for MR k-space trajectory correction.

FIG. 2 shows one embodiment of a flow chart of a method for training a network for reducing artifacts from trajectory infidelity in MR imaging. Using machine learning, the training is to output corrected k-space data or k-space shifts in response to input of corrupted k-space data. By learning to correct in the scan domain, the trajectory corrected k-space data may be used in reconstruction and result in less artifact. Once trained, the machine-learned model may be used with the learned values for learnable parameters of the model to reduce trajectory infidelity.

The method is implemented by a computer, such as a personal computer, workstation, and/or server. Other computers may be configured to perform the acts of FIG. 2. The MR scanner 100 or central control unit 26 of FIG. 1 may implement the method. In one embodiment, the computer and a database are used to machine train and store the samples and trained model. The stored model is then distributed to one or more MR scanners 100 for application using the model as fixed (i.e., the learned values of the variables are not changed for trajectory correction for a given patient and/or for different patients).

The method is performed in the order shown (i.e., top to bottom or numerical). Additional, different, or fewer acts may be provided. For example, act 203 is not provided where the machine is training to correct k-space data without estimating trajectory shifts. As another example, acts for gathering and/or accessing training data are performed.

In act 200, an architecture for a machine-learned model is defined. For example, a neural network is defined. The architecture is defined by user or manual programming of the architecture, such as defining layers, layer arrangement, nodes, activation functions, connections, and/or other learnable or fixed variables. An existing network may be selected and/or altered. The network may be defined from scratch using established building blocks or entirely from scratch.

The model is defined to have one or more input layers and one or more output layers. For example, the neural network is defined to have an input layer for receiving k-space data. The k-space data from an entire scan or a portion of an entire scan is input in parallel to the input layer.

Any architecture or layer structure for machine learning may be used. The architecture defines the structure (connections, layers, and nodes), learnable parameters, and relationships between parameters. In one embodiment, a convolutional, fully connected, or another neural network is used. Deep machine training is performed. Any number of hidden layers may be provided between the input layer and output layer. Other machine learning model architectures may be defined, such as a support vector machine.

In one embodiment, the neural network or model is defined to be an image-to-image network. For example, a U-net, autoencoder, or another encoder-decoder network is used. Convolution layers are used with down sampling and pooling in a first part or encoder, and convolution layers are used with up sampling and pooling in a second part or decoder.

The neural network includes the input layer for input of the k-space measurements. The neural network includes an output layer for output of corrected k-space data or estimated trajectory shifts. A distribution of multiple measures is input, and a distribution of multiple measures are output. In another embodiment, the output is a field of alterations to be made. Rather than directly outputting corrected k-space data, the output are differences that may be combined with the input corrupted k-space data to form the corrected k-space data.

Figure 3:
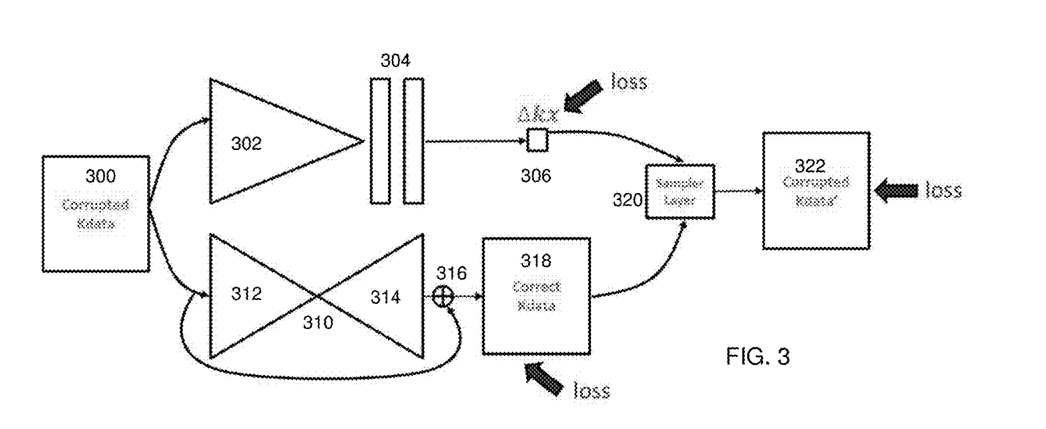
FIG. 3 illustrates an example architecture for trajectory infidelity correction.

Other example architectures may be used. For example, a model may be defined to have a more MR-physics related design by incorporating different flows, losses, and/or separable portions. FIG. 3 shows an example where multiple models or networks are combined into one model or network. The corrupted k-space data 300 is processed or input into two flows or portions. The different flows of the architecture allow the image-to-image network 310 to benefit from the training of the other network (e.g., encoder 302 and fully connected layers 304). The lower part may be used without the upper part or vice versa.

In the example of FIG. 3, the lower flow for input of the corrupted k-space data 300 is the part trained to directly estimate the corrected k-space data. The encoder 312 of the image-to-image network 310 receives the corrupted k-space data 300. The decoder 314 receives the output of the encoder 312 at the bottleneck or most abstraction with or without also receiving any skip connections from other layers or amounts of down sampling of the encoder 312. In the example of FIG. 3, the decoder 314 outputs differences or alterations to be made to the k-space data. The corrupted k-space data 300 is altered with the differences, such as summing 316, to form the corrected k-space data 318. This lower flow reconstructs the k-space data.

The upper flow for input of the corrupted k-space data 300 is a neural network 302, 304 defined to output one or more trajectory shifts 306. Instead of outputting changes to the values of the k-space data, the shift or shifts 306 of one or more trajectories are estimated. K-space locations shifts 306 are estimated. These shifts 306 may be used to alter the k-space data, used in reconstruction, or may be used to form corrupted k-space 322 data from corrected k-space data 318. In the example of FIG. 3, an encoder 302 formed as a convolutional neural network outputs to one or more fully connected layers 304. For example, the encoder 302 has five or other number of convolutional layers with down sampling and/or pooling for each or a sub-set (e.g., down sample with stride 2 and maxpool stride 2 for the first two of five layers and maxpooling and stride two for the second to last layer). This upper flow regresses the shifts of the corrupted k-space data 300.

Only the upper, only the lower, or both upper and lower flows and corresponding models may be used to correct the corrupted k-space data 300. In the example of FIG. 3, both are used in combination with a further calculation in a sampler layer 320. The sampler layer 320 may be a neural network or other machine learned layer or represents programmed calculation. The sampler layer 320 receives the output shifts 306 and corrected k-space data 318. The shifts 306 are applied to the corrected k-space data 318 using geometric relationship to reform the corrupted k-space data 322. Due to the estimation or inference, the output corrupted k-space data 322 is the same or different than the original input corrupted data 300. The arrangement combines the regression of the shifts 306 with the reconstruction of the corrected k-space data 318.

The defined architecture is used for machine training. The entire architecture or only parts of the architecture are used in application once trained. For example, only the lower flow (e.g., the reconstruction), only the upper flow (e.g., the regression with application of the shifts 306 to the corrupted data 300), or both are used to correct k-space data for a patient in application. In one embodiment, the image-to-image network 310 with the summation 316 is used to correct the k-space data in application but losses from the estimation of shifts 306 and the reformation of the corrupted k-space data 322 are used to assist in training the image-to-image network 310.

In act 202 of FIG. 2, a computer (e.g., image processor) machine trains the defined model for correction of trajectory infidelity in the input k-space data. To machine train, training data is gathered or accessed. To machine learn, the training data includes many sets of example inputs (e.g., corrupted k-space data) and corresponding ground truth (e.g., differences, shifts, and/or more ideal k-space data) and/or unsupervised learning metrics. Tens, hundreds, or thousands of sample MR scans are acquired, such as from scans of patients, scans of phantoms, simulation of MR scanning, and/or by image processing to create further samples. Many examples that may result from different scan settings, patient anatomy, MR scanner characteristics, or other variance that results in different samples in MR scanning are used. In one embodiment, the samples are for a particular type of MR scanning, such as echo planar or non-Cartesian trajectory scans. In other embodiments, scans from different types of MR scanning are used.

The training data may include other information for each sample. For example, the MR scanner characteristics are included. The coil sensitivity, bias-field correction, or other information for the MR scanner and corresponding scan for the patient may be included. Alternatively, only samples of corrupted k-space data are used.

Where the architecture is a neural network, the machine training is deep learning to learn features of the k-space data used to infer the output (e.g., differences in the data caused by trajectory infidelity or corrected data). With or without further processing (e.g., applying estimated differences and/or shifts to create corrected k-space data), the neural network (e.g., image-to-image network 310 or shift network 302, 304) learns to output data for corrected k-space data. The corrections represent direct or indirect changes to trajectories of the input k-space data. The neural network is trained to form the output in response to input of the corrupted k-space data.

In optional act 203, the trajectories of the input k-space data are altered according to the output changes. This alteration may be indirect by differences of values of the k-space measurements. Alternatively, the alteration is direct, such as applying the shifts in a reverse manner to the corrupted k-space data to create corrected k-space data.

The machine training of act 202 is an optimization. An optimization, such as Adam or RMSprop, is performed using the various samples and losses. The values of the learnable parameters that minimize the losses across the training samples are found using the optimization. The machine learns from the training data. The broad range of multiple examples of k-space measurements is used to learn.

The optimization may use cost functions for unsupervised learning. For supervised learning, such as shown in training the network of FIG. 3, the optimization uses loss of the network output relative to the ground truth. Any measure of loss or similarity may be used, such as L1 norm, L2 norm, or cross entropy loss.

Any number of losses may be used. For example, a U-net to estimate the difference or corrected k-space data is trained using a single loss based on difference of the corrected k-space data to the ground truth correct k-space data or a difference of a difference of the k-space data to the ground truth. As another example, one loss is based on corrected k-space data, and another loss is based on estimated shifts (difference between estimated trajectory shift and ground truth trajectory shift). Either loss is based on a difference between the input k-space data altered to have corrected trajectories and the ground truth correct k-space data. Sequential or joint training may be used where multiple losses are provided. For sequential, one part of the network is trained using one loss, and then the other part of the network is trained using the other loss. For joint training, the losses from different parts are combined or used at a same time to train both parts of the network.

In the embodiment of FIG. 3, joint training of the lower network (310) and the upper network 302, 304 is performed. The joint training uses two or three losses. For example, three losses are used, the first loss being for corrected k-space data 318, the second loss being for the trajectory shift 306, and the third loss being for corrupted k-space data 322 formed from the corrected k-space data 318 and the trajectory shift 306. Each loss uses a same or different loss function. The losses are combined by averaging, weighted averaging, or another function.

The trajectory shifts loss may be calculated by comparing the estimated shift 306 to ground truth shift. The ground truth location shifts may be obtained using conventional correction methods that calculate the shift. These correction methods are complex models with an exponential term for the shift. Due to the complexity, it may take time to estimate shifts for a patient. By training a network to estimate the shifts, more rapid estimation may be provided. The ground truth location shifts are alternatively or additionally determined using MR simulation, such as a simulation that includes trajectory corruption.

The corrupted k-space data loss may be calculated by comparing the reproduced corrupted k-space data to the input corrupted k-space data. The original samples of the corrupted k-space data may be from patient scans, phantom scans, and/or MR simulation of scans. In one embodiment, the input samples of the corrupted k-space data are generated by bilinear interpolation of input data with a flow-field grid where an output is computed using locations from the grid. The grid may be normalized to have grid values in the range of $[-1, 1]$ by the input height and width.

The corrected k-space data loss may be calculated by comparing the corrected k-space data to ground truth correct k-space data or k-space data with less trajectory infidelity. The correct k-space data (ground truth) may be calculated from simulation or from k-space data resulting from other methods for trajectory correction. For a cost function or unsupervised approach, the artifact level in the corrected k-space data may be measured or calculated and used for optimization (e.g., minimize the level of artifact). Alternatively, the corrected k-space data is reconstructed and the level of artifact for the cost function is measured from the reconstructed representation or an MR image formed from the reconstructed representation. Network-based artifact detection may be used.

After training, the machine-learned model is represented as a matrix, filter kernels, and/or architecture with the learned values. The learned convolution kernels, weights, connections, and/or layers of the neural network or networks are provided.

In act 204 of FIG. 2, the computer or image processor stores the machine-learned neural network or other model resulting from the machine learning. The values of learnable parameters and the architecture of the machine-learned model are saved in memory. The machine-learned neural network may be stored locally or transferred over a network or by moving the memory to other computers, workstations, and/or MR scanners.

The network or other model resulting from the machine training using the plurality of the samples is stored. This stored model has fixed weights or values of learnable parameters determined based on the machine training. These weights or values are not altered by patient-to-patient or over multiple uses for different MR scans. The weights or values are fixed, at least over a number of uses and/or patients. The same weights or values are used for different sets of MR scan data corresponding to different patients. The same values or weights may be used by different MR scanners. The fixed machine-learned model is to be applied without needing to further train as part of the application.

The training may be updated, such as retraining based on additional samples gathered through use of the machine-learned network.

Figure 5:
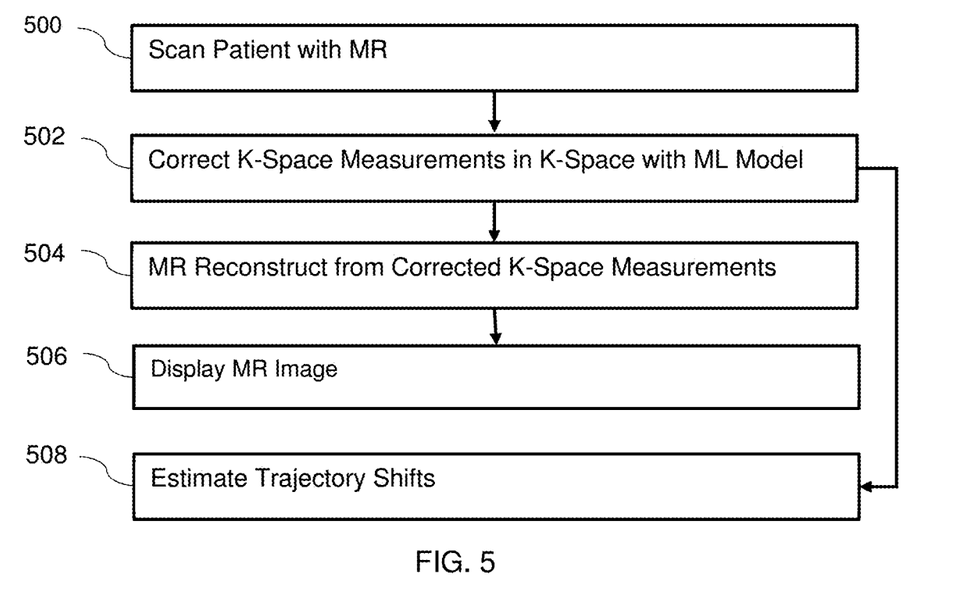
FIG. 5 is a flow chart diagram of one embodiment of a method for trajectory infidelity correction using a machine-learned model operating in k-space.

FIG. 5 is a flow chart diagram of one embodiment of a method for k-space trajectory infidelity correction in a MR imaging system. A machine-learned model as trained is applied. The machine-learned model, having been trained, generates k-space corrections (e.g., difference or change in k-space data, trajectory shifts, and/or corrected k-space data) from k-space data measured for a patient. The correction occurs in k-space rather than after or even part of reconstruction. For estimated shifts, the correction may occur in reconstruction by using the trajectories with corrected shifts.

The method is performed by the system of FIG. 1 or another system. The MR scanner scans the patient. An image processor estimates the corrections and/or corrects the k-space data. The image processor reconstructs from the corrected k-space data. A display displays the MR image from the reconstruction. Other components may be used, such as a remote server or a workstation performing the correction, reconstruction and/or display.

The method is performed in the order shown or other orders. Additional, different, or fewer acts may be provided. For example, preset, default, or user input settings are used to configure the scanning prior to act 500. As another example, the MR image is stored in a memory (e.g., computerized patient medical record) or transmitted over a computer network instead of or in addition to the display of act 506. Act 508 may be optional or not provided.

In act 500, the MR system scans a patient with an MR sequence. For example, the MR scanner or another MR system scans the patient with an MR echo planar imaging or another MR sequence. The MR sequence may use Cartesian, radial, spiral, or another trajectory pattern. Based on the configuration of the MR scanner, a pulse sequence is created. The pulse sequence is transmitted from coils into the patient. The resulting responses are measured by receiving radio frequency signals at the same or different coils. The scanning results in k-space measurements as the scan data. These k-space measurements for a given patient are new and/or not included in the samples for training. The k-space measurements correspond to or include the k-space trajectories.

In act 502, an image processor corrects the k-space measurements for errors in the k-space trajectories. The correction alters the values of some or all of the k-space measurements. The correction may alter a shift of locations of the k-space measurements. The correction may be to provide replacement k-space measurements or replacement trajectories.

The correction includes input of the k-space measurements from the scan of act 500 to a machine-learned model. The machine-learned model is a deep learned autoencoder network, such as a U-Net, in one embodiment. In another embodiment, the machine-learned model is a convolutional encoder with fully connected networks receiving feature values from the encoder for estimating trajectory shifts. Other neural networks, such as Densenets, image-to-image networks, fully connected networks, and/or convolutional neural networks may be used.

The machine-learned model may have been trained alone. Alternatively, the machine-learned model was trained as one part or one neural network trained in conjunction with (e.g., jointly trained) with another part or another neural network. For example, one network was trained to estimate trajectory shifts and the other network was trained to estimate k-space measurement differences due to trajectory infidelity and/or to estimate corrected k-space data (i.e., data with reduced artifact from trajectory infidelity). This dual or triple network (see FIG. 3) may have been trained with two or more losses, such as trained using a loss for trajectory shift, a loss for k-space correction, and a loss for an estimate of corrupted data estimated from the trajectory shift and the k-space correction. By jointly training, the losses of one aspect inform the values learned in the network for the other aspect. The values of learnable parameters may be different due to the losses used in training, providing for more accurate correction.

The machine-learned model, in application of act 502, outputs corrected k-space measurements in response to the input. The model output may be shifts, differences, or replacement (corrected) k-space data. If shifts or differences, the shifts or differences are applied to alter the k-space data. Alternatively, the shifts are used in reconstruction to account for the trajectory infidelity in the inverse Fourier transform to object space.

In act 504, the image processor reconstructs an MR image from the corrected k-space measurements of the patient. For reconstruction, the k-space data is Fourier transformed into scalar values representing different spatial locations, such as spatial locations (pixels or voxels) representing a plane (area) or volume in the patient. Scalar pixel or voxel values are reconstructed. The spatial distribution of MR measurements in object or image space is formed. This spatial distribution represents the patient in two or three dimensions.

Any now known or later developed MR reconstruction may be used. For example, an inverse Fourier transform is applied. Other direct reconstructions may be used. Iterative reconstruction, such as conjugate gradient, LSQR, or non-linear conjugate gradient, is performed in other embodiments. In other embodiments, a machine-learned model is used. The machine-learned model outputs an image or object domain representation of the patient in response to input of the corrected k-space measurements.

The output of the MR reconstruction is a two-dimensional distribution of pixels representing an area of the patient and/or a three-dimensional distribution of voxels representing a volume of the patient. Other processing may be performed on the input k-space measurements or on the output corrected k-space measurements. Other processing may be performed on the output representation or reconstruction, such as spatial filtering, color mapping, and/or display formatting.

In act 506, a display (display screen) displays an MR image. The image processor creates an MR image for display. The MR image is formatted for display on the display. The display presents the MR image for viewing by the user, radiologist, physician, clinician, and/or patient. The image is generated from the k-space measurements and assists in diagnosis. By having fewer or less artifact due to trajectory infidelity, the MR image may be more useful for diagnosis.

The display and corresponding MR image is two-dimensional. The image processor renders the voxels or pixels to a two-dimensional display. Where the reconstructed representation is two-dimensional or the image is of a plane through a three-dimensional representation, interpolation, color mapping, and/or other process generates the MR image from the representation. Where the representation is three-dimensional, the image processor may perform volume or surface rendering to generate a display image as a further MR image.

In act 508, the image processor estimates trajectory shifts. In addition to correcting k-space measurements, the trajectory shifts may be estimated for other purposes. A different machine-learned model, such as the machine-learned model 302, 304 of FIG. 3, estimates the shifts. The shifts are estimated by the machine-learned model in response to input of the corrupted k-space data or both the corrupted and corrected k-space data. While these shifts may be used in reconstruction or through a geometric model to correct k-space data, the shifts may be used for other purposes.

The additional estimation of the k-space location shifts may be used to better assess the performance of the machine-learned model for correcting the measurements. For example, the shifts are estimated for corrected k-space measurements. These shifts indicate the remaining trajectory infidelity after correction. The shifts from before and after correction may be compared as another indication of performance. The additional estimation of the k-space location shifts from the corrupted k-space data may be used for hardware assessment. Different hardware may produce different levels of trajectory infidelity. The shifts are estimated as a measure of the hardware performance with respect to trajectory shift. The estimated shifts may be used for a given MR system preceding scanning correction to indicate a current performance. The estimated shifts may be used in other post-processing to further reduce the shifts, such as estimating shifts in corrected k-space data for use in artifact reduction in the image or object domain.

Figure 6:
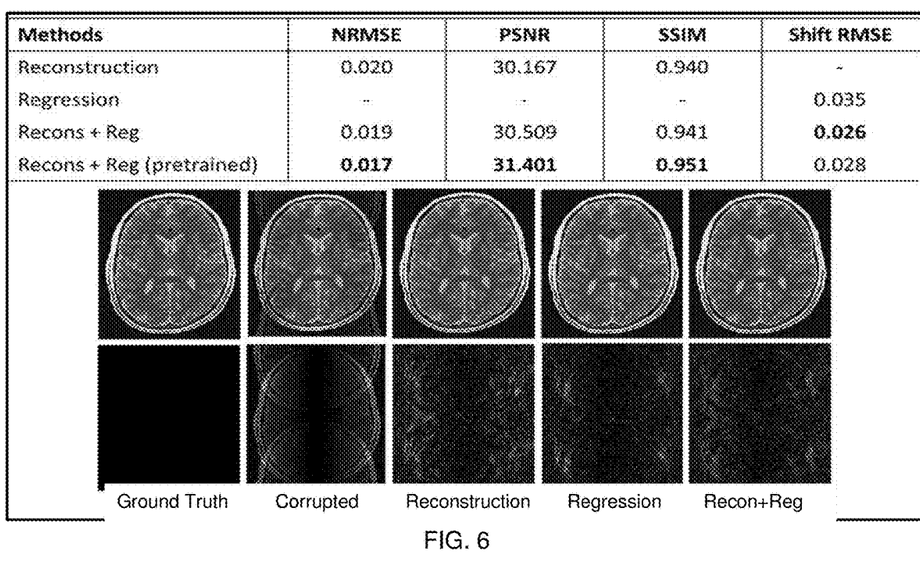
FIG. 6 illustrates performance and images associated with trajectory correction in k-space using different machine-learned model approaches.

FIG. 6 shows example performance. For the reconstruction method, the U-Net 310 for predicting differences and summation 316 of FIG. 3 is used. The training is for this part only. For the regression method, the shift estimation by the encoder 302 and fully connected network 304 is used. The training is for this part only. The estimated shifts 306 are then applied to correct the corrupted k-space data 300. For the reconstruction+regression, the full arrangement of FIG. 3 is used for training. The U-Net 310 for predicting differences and the summation 316 or both reconstruction and regression are used in application. The reconstruction+regression may be initialized using randomized or noise values for training or may be pre-trained.

FIG. 6 shows an upper row of echo planar images for the different approaches. The bottom row shows artifacts of the planar images. The ground truth has no artifact. The artifact level for corrected k-space data is measured with normalized root mean square error (NRMSE), peak signal-to-noise ratio (PSNR), and structural similarity (SSIM). The performance of the shift estimates are measured with shift RSME. By training both networks jointly, fewer errors and greater similarity results. The Reconstruction+Regression in training improves Nyquist ghosting removal compared to reconstruction alone or regression alone.

FIG. 1 shows one embodiment of a system for trajectory correction in MR imaging. The system uses a machine-learned model to correct k-space data prior to reconstruction. Rather than removing artifacts in the image domain, a machine-learned model is trained to reduce trajectory infidelity in the k-space domain.

The system is implemented by an MR scanner or system, a computer based on data obtained by MR scanning, a server, or another processor. MR scanning system 100 is only exemplary, and a variety of MR scanning systems can be used to collect the MR data. In the embodiment of FIG. 1, the system is or includes the MR scanner or MR system 100. The MR scanner 100 is configured to scan a patient. The scan provides scan data in a scan domain. Frequency domain components representing MR scan data are acquired. The system 100 scans a patient to provide k-space measurements (measurements in the frequency domain), which may be stored in a k-space storage array. In the system 100, magnetic coils 12 create a static base magnetic field in the body of patient 11 to be positioned on a table and imaged. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generates magnetic field pulse sequences. The shimmed gradients compensate for inhomogeneity and variability in an MR imaging device magnetic field resulting from patient anatomical variation and other sources. The magnetic field gradients include a slice-selection gradient magnetic field, a phase-encoding gradient magnetic field, and a readout gradient magnetic field that are applied to patient 11.

RF (radio frequency) module 20 provides RF pulse signals to RF coil 18, which in response produces magnetic field pulses that rotate the spins of the protons in the imaged body of the patient 11 by ninety degrees, by one hundred and eighty degrees for so-called "spin echo" imaging, or by angles less than or equal to 90 degrees for so-called "gradient echo" imaging. Gradient and shim coil control module 16 in conjunction with RF module 20, as directed by a central control unit 26, control slice-selection, phase-encoding, readout gradient magnetic fields, radio frequency transmission, and magnetic resonance signal detection, to acquire magnetic resonance signals representing planar slices of patient 11.

In response to applied RF pulse signals, the RF coil 18 and/or local coils receives MR signals, i.e., signals from the excited protons within the body as they return to an equilibrium position established by the static and gradient magnetic fields. The MR signals are detected and processed by a detector within RF module 20 and k-space component processor unit 34 to provide an MR dataset to an image data processor for processing into an image (i.e., for reconstruction in the object domain from the k-space data in the scan domain). In some embodiments, the image data processor is located in or is the central control unit 26. However, in other embodiments, such as the one depicted in FIG. 1, the image data processor is located in a separate unit 27. ECG synchronization signal generator 30 provides ECG signals used for pulse sequence and imaging synchronization. A two- or three-dimensional k-space storage array of individual data elements in k-space component processor unit 34 stores corresponding individual frequency components comprising an MR dataset. The k-space array of individual data elements has a designated center, and individual data elements individually have a radius to the designated center.

A magnetic field generator (comprising coils 12, 14 and 18) generates a magnetic field for use in acquiring multiple individual frequency components corresponding to individual data elements in the storage array. The individual frequency components are successively acquired using a Cartesian or non-Cartesian (e.g., radial or spiral) acquisition strategy as the multiple individual frequency components are sequentially acquired during acquisition of an MR dataset representing an MR image. A storage processor in the k-space component processor unit 34 stores individual frequency components acquired using the magnetic field in corresponding individual data elements in the array. The row and/or column of corresponding individual data elements alternately increases and decreases as multiple sequential individual frequency components are acquired. The magnetic field acquires individual frequency components in an order corresponding to a sequence of substantially adjacent individual data elements in the array, and magnetic field gradient change between successively acquired frequency components is substantially minimized. The central control processor 26 is programmed to sample the MR signals according to a predetermined sampling pattern. Any MR scan sequence may be used, such as for T1, T2, or other MR parameter. In one embodiment, echo planar imaging or non-Cartesian sensing scan sequence is used.

The central control unit 26 also uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging.

The k-space ordering processor 34, radio frequency system 20, central control unit 26 and/or processor 27 is an image processor that alters trajectories of the k-space measurements by directly changing the k-space measurements or by estimating shifts applied in reconstruction. The image processor alters the trajectories by application of a machine-learned model to the scan data (i.e., k-space measurements). The image processor is a general processor, digital signal processor, three-dimensional data processor, graphics processing unit, application specific integrated circuit, field programmable gate array, artificial intelligence processor, digital circuit, analog circuit, combinations thereof, or other now known or later developed device for MR reconstruction. The image processor is a single device, a plurality of devices, or a network. For more than one device, parallel or sequential division of processing may be used. Different devices making up the image processor may perform different functions, such as estimating shifts or correcting measurements in k-space by one device and reconstructing by another device. In one embodiment, the image processor is a control processor or other processor of the MR scanner 100.

Other image processors of the MR scanner 100 or external to the MR scanner 100 may be used. The image processor is configured by software, firmware, or hardware to reconstruct.

In one embodiment, the image processor is configured to apply a deep learned encoder-decoder network as the machine-learned model. Other models may be used. The machine-learned model being applied was previously trained using a loss for trajectory shift, a loss for k-space correction, and/or a loss for an estimate of corrupted data estimated from the trajectory shift and the k-space correction. Multiple neural networks may be trained jointly, in sequence, or iteratively, such as jointly training a neural network for k-space data correction and another neural network for estimation of trajectory shift in k-space.

The alternation occurs in one of various ways. The image processor is configured to output k-space measurements with values reflecting less trajectory shift. Alternatively or additionally, the image processor is configured to output estimated shifts in k-space, which shifts may be used in reconstruction to correct. The direct correction and/or estimation of shift is performed in the scan domain prior to reconstruction and/or from data in the scan domain. Both direct correction and estimation of trajectory shifts using different neural networks or machine-learned models may be used.

The image processor is configured to reconstruct a representation in an object domain from the scan data in the scan domain. The corrected k-space data or trajectory shifts in k-space are used in reconstruction to transform the k-space measurements to the image or object domain. In the image or object domain, a two or three-dimensional distribution of pixels or voxels represents an area or volume of the patient. The object domain is an image space and corresponds to the spatial distribution of the patient. A planar area or volume representation is reconstructed. For example, pixels values representing tissue in an area or voxel values representing tissue distributed in a volume are generated.

Generated images of the reconstructed representation for a given patient are presented on display 40 of the operator interface. Computer 28 of the operator interface includes a graphical user interface (GUI) enabling user interaction with central control unit 26 and enables user modification of magnetic resonance imaging signals in substantially real time. Display processor 37 processes the magnetic resonance signals to provide image representative data for display on display 40, for example. An MR image from the reconstructed representation is displayed on the display 40. The MR image may be a rendering, such as volume rendering of voxels, to the two-dimensional display screen.

The display 40 is a CRT, LCD, plasma, projector, printer, or other display device. The display 40 is configured by loading an image to a display plane or buffer. The display 40 is configured to display the reconstructed MR image.

Although the subject matter has been described in terms of exemplary embodiments, it is not limited thereto. Rather, the appended claims should be construed broadly, to include other variants and embodiments, which can be made by those skilled in the art.

What is claimed is:

1. A method for k-space trajectory infidelity correction in a magnetic resonance (MR) imaging system, the method comprising:
    scanning, by the MR imaging system, a patient with an MR sequence, the scanning resulting in k-space measurements corresponding to k-space trajectories;
    correcting the k-space measurements for errors in the k-space trajectories, the correcting being by input of the k-space measurements to a machine-learned model which outputs corrected k-space measurements in response to the input, the machine-learned model having been trained using a loss for trajectory shift, a loss for k-space correction, and a loss for an estimate of corrupted data estimated from the trajectory shift and the k-space correction;
    reconstructing an MR image from the corrected k-space measurements; and
    displaying the MR image.

2. The method of claim 1 wherein scanning comprises echo planar imaging.

3. The method of claim 1 wherein scanning comprises scanning with the k-space trajectories comprising non-Cartesian trajectories.

4. The method of claim 1 wherein correcting comprises correcting by the machine-learned model, the machine-learned model comprising a deep learned autoencoder network.

5. The method of claim 1 wherein reconstructing comprises reconstructing a two- or three-dimensional distribution of pixels or voxels, respectively, representing an area or volume, respectively, of the patient, and wherein displaying comprises rendering from the voxels or pixels to a two-dimensional display.

6. The method of claim 1 wherein correcting comprises correcting by the machine-learned model having been trained as a first neural network trained in conjunction with a second neural network trained to estimate trajectory shifts.

7. The method of claim 1 further comprising estimating trajectory shifts by another machine-learned model, the trajectory shifts estimated in response to input of the k-space data from the scanning to the other machine-learned model.

8. A system for trajectory correction in magnetic resonance (MR) imaging, the system comprising:
    an MR scanner configured to scan a patient, the scan providing first scan data in a scan domain;
    an image processor configured to alter trajectories of the first scan data by application of a machine-learned model to the first scan data, the machine-learned model outputting second scan data in the scan domain, the second scan data having the altered trajectories, and the image processor configured to reconstruct a representation in an object domain from the second scan data in the scan domain, wherein the machine-learned model was previously trained using a loss for trajectory shift, a loss for k-space correction, and a loss for an estimate of corrupted data estimated from the trajectory shift and the k-space correction; and
    a display configured to display an MR image from the reconstructed representation.

9. The system of claim 8 wherein the MR scanner is configured to scan the patient with echo planar imaging or non-Cartesian trajectories.

10. The system of claim 8 wherein the machine-learned model comprises a deep learned encoder-decoder network.

11. The system of claim 8 wherein the representation is a three-dimensional distribution of voxels representing a volume of the patient, and wherein the MR image is a rendering of the voxels to the display comprising a two-dimensional display.

12. The system of claim 8 wherein the machine-learned model was trained as a first neural network trained in conjunction with a second neural network trained to estimate trajectory shifts.

13. The system of claim 8 wherein the image processor is configured to estimate trajectory shifts by application of another machine-learned model, the trajectory shifts estimated in response to input of the first scan data in the scan domain to the other machine-learned model.

14. A method for training a network for reducing artifacts from trajectory infidelity in magnetic resonance (MR) imaging, the method comprising:
    defining a first neural network to receive input k-space data;
    defining a second neural network to receive the input k-space data and output a trajectory shift;
    jointly machine training the first neural network and second neural network for correction of trajectory infidelity in the input k-space data; and
    storing a machine-learned model resulting from the joint training.

15. The method of claim 14 wherein defining comprises defining the first neural network as an image-to-image network.

16. The method of claim 14 wherein machine training comprises deep learning by the first neural network to output changes to trajectories of the input k-space data in response to input of the input k-space data;

further comprising altering the trajectories of the input k-space data according to the output changes; and wherein machine training further comprises machine training with a loss based on a difference between the input k-space data with the altered trajectories and a ground truth.

17. The method of claim 14 wherein machine training comprises the joint training with first, second and third losses, the first loss being for corrected k-space data, the second loss being for the trajectory shift, and the third loss being for corrupted k-space data formed from the corrected k-space data and the trajectory shift.

* * * * *